(12) United States Patent
Bainier et al.

(10) Patent No.: US 12,199,564 B2
(45) Date of Patent: Jan. 14, 2025

(54) PHOTOVOLTAIC MODULE WITH ENHANCED HEAT EXTRACTION

(71) Applicant: TOTALENERGIES ONETECH, Courbevoie (FR)

(72) Inventors: Camille Bainier, Sceaux (FR); Christoph Sachs, Buc (FR); Nicolas Champagne, Caluire et Cuire (FR)

(73) Assignee: TOTALENERGIES ONETECH, Corbevoie (FR)

( * ) Notice: Subject to any disclaimer, the term of this patent is extended or adjusted under 35 U.S.C. 154(b) by 0 days.

(21) Appl. No.: 17/925,645

(22) PCT Filed: Mar. 18, 2021

(86) PCT No.: PCT/EP2021/057029
§ 371 (c)(1),
(2) Date: Nov. 16, 2022

(87) PCT Pub. No.: WO2021/239286
PCT Pub. Date: Dec. 2, 2021

(65) Prior Publication Data
US 2023/0283231 A1    Sep. 7, 2023

(30) Foreign Application Priority Data
May 29, 2020 (EP) .................................. 20315285

(51) Int. Cl.
*H02S 40/42* (2014.01)
*H01L 31/048* (2014.01)

(52) U.S. Cl.
CPC .......... *H02S 40/425* (2014.12); *H01L 31/048* (2013.01)

(58) Field of Classification Search
CPC ............................ H02S 40/425; H01L 31/048
See application file for complete search history.

(56) References Cited

U.S. PATENT DOCUMENTS

| 2012/0291851 | A1 | 11/2012 | Zhu |
| 2016/0359447 | A1* | 12/2016 | Hund ...................... H02S 40/32 |
| 2017/0054409 | A1* | 2/2017 | Larsson ................ H01L 31/048 |

FOREIGN PATENT DOCUMENTS

| DE | 202015102947 U1 | 7/2015 |
| KR | 20150138614 A | 12/2015 |
| WO | 2009061495 A1 | 5/2009 |

OTHER PUBLICATIONS

Joshi et al, IN 201921021258 A, English Abstract. (Year: 2019).*
Applicant: Totalenergies Onetech; "Photovoltaic Module With Enhanced Heat"; International Patent Application No. PCT/EP2021/057029 filed Mar. 18, 2021; PCT International Search Report and Written Opinion dated Jun. 9, 2021; 10 pgs.

* cited by examiner

*Primary Examiner* — Tae-Sik Kang
(74) *Attorney, Agent, or Firm* — Tarolli, Sundheim, Covell & Tummino LLP

(57) ABSTRACT

The invention relates to a photovoltaic module comprising a front bonding layer to photovoltaic cells are attached, such that the front side of each photovoltaic cell is attached to the front bonding layer. The photovoltaic module further comprises an open container containing a dielectric heat transfer fluid. The container comprises a bottom wall and side walls wherein the front bonding layer is disposed on top of the open container in order to close the container such that at least part of the backside (6a) of each photovoltaic cell is in contact with the dielectric heat transfer fluid.

15 Claims, 5 Drawing Sheets

PHOTOVOLTAIC MODULE WITH ENHANCED HEAT EXTRACTION

CROSS-REFERENCE TO RELATED APPLICATIONS

This application is a U.S. National Stage Application filed under 35 U.S.C. § 371 of PCT/EP2021/057029, filed Mar. 18, 2021, and entitled PHOTOVOLTAIC MODULE WITH ENHANCED HEAT EXTRACTION, which International Application claims the benefit of priority from European Patent Application No. 20315285.5, filed on May 29, 2020. The entire contents of each of the above-identified patent applications are incorporated herein by reference.

TECHNICAL FIELD OF THE INVENTION

The invention relates to the field of photovoltaic modules, and more particularly the field of photovoltaic modules with enhanced thermal management, especially heat extraction. The invention also relates to the method for manufacturing such a photovoltaic module.

BACKGROUND OF THE INVENTION

It is well-known in the field of photovoltaics that the efficiency of photovoltaic devices based on indirect bandgap materials such as silicon decreases with increasing temperature. As a consequence, the power output of PV installations decreases with their increasing operating temperature. This effect is particularly noticeable in sunny and hot climates, for example in deserts. In such an environment, the photovoltaic cell operation temperature can reach up to about 80° C. at mid-day.

Under these circumstances, the excess heat generated inside the photovoltaic cells is conducted and dissipated through both sides—in particular the backside—of the photovoltaic modules. However, in a hot climate the heat dissipation becomes less efficient, especially if the ambient temperature approaches 40° C. or more. In addition, the low thermal conductivity of materials used in standard PV modules impedes an effective, heat dissipation from the inside of the module to the environment. In case, the heat is not efficiently dissipated, the performance of photovoltaic modules decreases and potential electrical power that could have been generated at lower operation temperature is lost.

The main purpose of the invention is therefore to propose more efficient heat management for photovoltaic modules, leading especially to better control and for example to a reduction of the operating temperature of photovoltaic modules and installations and to an improvement of the system performance.

SUMMARY OF THE INVENTION

To that end, the invention relates to a photovoltaic module characterized in that it comprises:
a front bonding layer;
photovoltaic cells attached to the front bonding layer, such that the front side of each photovoltaic cell is attached to the front bonding layer;
an open container containing a dielectric heat transfer fluid, the container comprising a bottom wall and side walls; wherein
the front bonding layer is disposed on top of the open container in order to close the container such that at least part of the backside of each photovoltaic cell is in contact with the dielectric heat transfer fluid.

Thus, the dielectric heat transfer fluid is directly in contact with the backside of the photovoltaic cells, allowing efficient heat extraction from the photovoltaic module, in particular directly at the level of the photovoltaic cells. Therefore, the operating temperature may be efficiently controlled and reduced, so that the performance and power output of photovoltaic module may be increased, in particular in very hot environments like deserts for example. In addition, the dielectric heat transfer fluid provides sufficient properties in terms of electrical resistance, safety and long-term stability for stable functioning of the photovoltaic modules over the whole lifetime, which may be more than 10 years, in particular, about 25 years.

The method according to the invention may comprise one or several of the following features taken alone or in combination:

The side walls of the open container and the front bonding layer are for example fixed tightly together.

According to a particular embodiment of the invention, the side walls of the open container and the front bonding layer are for example fixed together by lamination.

In this way the thickness of photovoltaic module can be optimized and the photovoltaic modules can be arranged in a space-saving manner. In addition, polymerization reactions occurring during lamination ensure a very strong bonding between the surfaces of the photovoltaic module elements to be bonded. The lamination of the photovoltaic module may be carried in two steps. Once the photovoltaic cells are assembled with the bonding layer by lamination, then the bonding layer comprising the photovoltaic cells is assembled with the open container.

According to a particular embodiment of the invention, the side walls of the open container and the front bonding layer might be fixed together through sealing elements.

Thus, the side walls of the open container and the front bonding layer can be fixed at ambient temperature and sealing elements may adapt to different form of photovoltaic modules. In addition, the fixing may be reversible which allows, for example, maintenance or replacements of some defective parts.

The side walls of the open container present, for example, an assembly rim perpendicular to the side wall and sealing elements comprise for example a seal, in particular an adhesive seal comprising for example an elastomer.

The presence of the assembly rim helps to dampen the stress that may occur at the contact between the container and the front bonding layer. This way, the lifespan of the container and the front bonding layer may be extended.

The sealing elements may comprise clamping elements.

The clamping elements allow strengthening the fixing of the front bonding layer on the container.

The container may be made of a transparent material, in particular glass or a transparent plastic material like polycarbonate or PMMA and, in this case, the dielectric fluid is also transparent.

In particular, the dielectric heat transfer fluid presents a transmittance of more than 70%, and preferably more than 90%, for working wavelength range of the photovoltaic cells 6.

Thus, light can also pass through the backside of the photovoltaic module in order to enhance the photovoltaic conversion efficiency of the photovoltaic module.

At least one or all photovoltaic cells may be bifacial photovoltaic cells.

The backside of the bifacial photovoltaic cell can capture the diffuse reflection of solar radiation, known as albedo. Therefore, higher photovoltaic conversion efficiency can be achieved.

The open container comprises for example a dielectric fluid inlet and a dielectric fluid outlet allowing circulation of the dielectric fluid within the container.

Thus, the photovoltaic module can be connected to an external hydraulic circuit.

At least one wall, in particular the bottom wall may comprise protuberances for enhancing heat exchange between the dielectric fluid and the photovoltaic cells.

In particular, protuberances enhance redirection and mixing of the dielectric fluid such that the heat may be extracted efficiently. It also contributes to avoid dead or stagnation zones.

The container comprises for example separation walls fixed to the bottom wall and fixed to the front bonding layer for forming U-shaped circulation path for enhancing heat exchange between the dielectric fluid and the photovoltaic cells.

Thus, the temperature of the dielectric heat transfer fluid is more homogeneous and allows avoiding dead zones.

The photovoltaic cells are attached to the front bonding layer such that they are placed over the U-shaped circulation path. In other words, the photovoltaic cells do not overlap the separation walls. In addition, such separation walls might contribute to the mechanical strength of module. In addition, such separation walls might contribute to the mechanical strength of module.

The dielectric heat transfer fluid presents for example:
a resistivity of at least 1MΩ·m between 20° C. and 130° C., more specifically from 20 MΩ·m to 5000 GΩ·m between 20° C. and 130° C.;
a cinematic viscosity is lower than 25 mm$^2$/s at 40° C. and may be lower than 10 mm$^2$/s at 40° C.

In addition, the dielectric heat transfer fluid is electrically insulating. Furthermore, the chemical structure of the fluid is designed to have a good life span.

The dielectric heat transfer fluid further presents at least one of the following features:
a thermal conductivity ranging from 105 to 180 mW/(m·K) at 25° C.;
a heat capacity ranging from 1500 to 3000 J/g·K, in particular around 2000 J/g·K; and
a volumetric mass density ranging from 700 to 1100 kg/m$^3$ at 25° C.

Thus, the dielectric heat transfer fluid can extract satisfactorily excess heat from the surface of the photovoltaic cell.

The invention also relates to a photovoltaic energy production system comprising:
at least one photovoltaic module according to the invention;
at least one heat exchanger portion;
at least one pump;
the photovoltaic module, the heat exchanger portion and the pump are fluidically connected together to form a closed circuit for circulation of the dielectric heat transfer fluid.

Thus, the dielectric fluid in the container may be renewed when the temperature of the dielectric heat transfer fluid is higher than a preset value.

According to a particular embodiment of the invention, the heat exchanger portion may be buried in a ground.

In most of cases, the ground temperature, in particular at a depth of more than 1 m, is at a constant value regardless the weather conditions. This way, the heat exchange between the dielectric heat transfer fluid and the photovoltaic cells can be optimized with little power consumption and the heat can be efficiently extracted.

According to a particular embodiment of the invention, the heat exchanger portion may be formed by a classical heat exchanger.

Thus, the temperature of the fluid can be controlled effectively using the heat exchanger.

The invention also relates to a method for manufacturing a photovoltaic module according to the invention, comprising the following steps:
providing a front bonding layer with photovoltaic cells attached to the backside of the front bonding layer; and
fixing the front bonding layer to an open container such that at least part the backside of each photovoltaic cell is in contact with a dielectric heat transfer fluid when the container is filled with such dielectric fluid.

According to a particular embodiment of the invention, the fixing is for example realized through a lamination step.

According to a particular embodiment of the invention, the fixing is realized for example through a clamping step.

The method may further comprise the step of providing a dielectric fluid inlet and outlet to the container.

BRIEF DESCRIPTION OF THE DRAWINGS

Other features and advantages would appear by reading the following description, given as an illustrative and non-restrictive example, and with the annexed drawings in which.

On the drawing, the same elements have the same numeral references.

The following embodiments are examples. Even if the specification refers to one or more embodiments, this does not necessary imply that each reference concerns the same embodiment, or that the technical features may only be applied to one and only embodiment. Simple technical features of different embodiments may be combined or interchanged in order to obtain other embodiments.

DETAILED DESCRIPTION OF THE INVENTION

In the following description, the term "photovoltaic module" shall be understood as the simplest unit for the production of electrical energy (direct current) comprising an assembly of interconnected photovoltaic cells or a layer of photovoltaic cells strings completely protected from the external environment.

Moreover, in the following description, the terms "top", "bottom" are defined according to the standard vertical axis, and are corresponding to the general configuration of the disposed elements into the photovoltaic module.

Furthermore, in the following description, the terms "frontal" or "front" are used to refer to a layer of the photovoltaic module through which the light rays first pass when the photovoltaic module is installed. In contrast, the term "back" is used is used to refer to a layer of the photovoltaic module that is intended to be the last layer through which the light rays pass when the photovoltaic module is installed. By analogy, this applies also to the terms "front side", "backside" of each element of the photovoltaic module.

In the following description, the term "performance" is intended to take into account the efficiency and/or safety integrity of the photovoltaic module such as its conversion efficiency and its life span.

Figure 1:
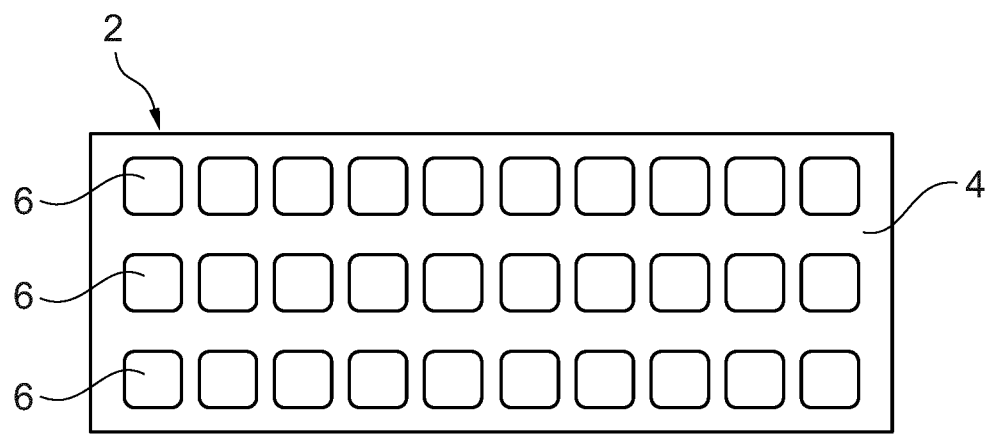
FIG. 1 is a top view of a photovoltaic module.

FIG. 1 represents a top view of a photovoltaic module 2. The photovoltaic module 2 comprises the front bonding layer 4 to which photovoltaic cells 6 are attached.

Figure 2:
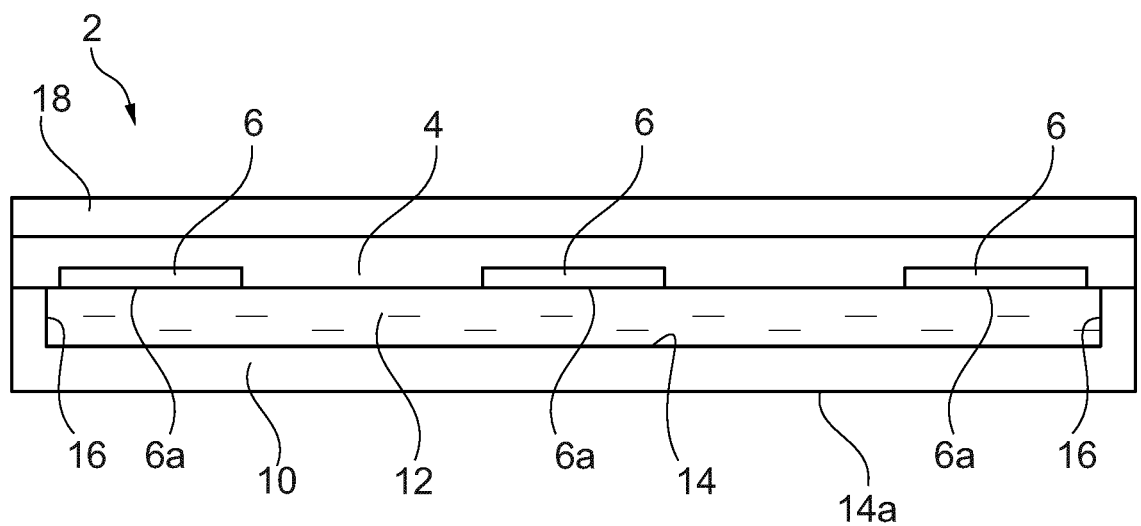
FIG. 2 is a schematic cross-sectional view of a photovoltaic module according to a first particular embodiment wherein the elements are fixed by lamination.
Figure 3:
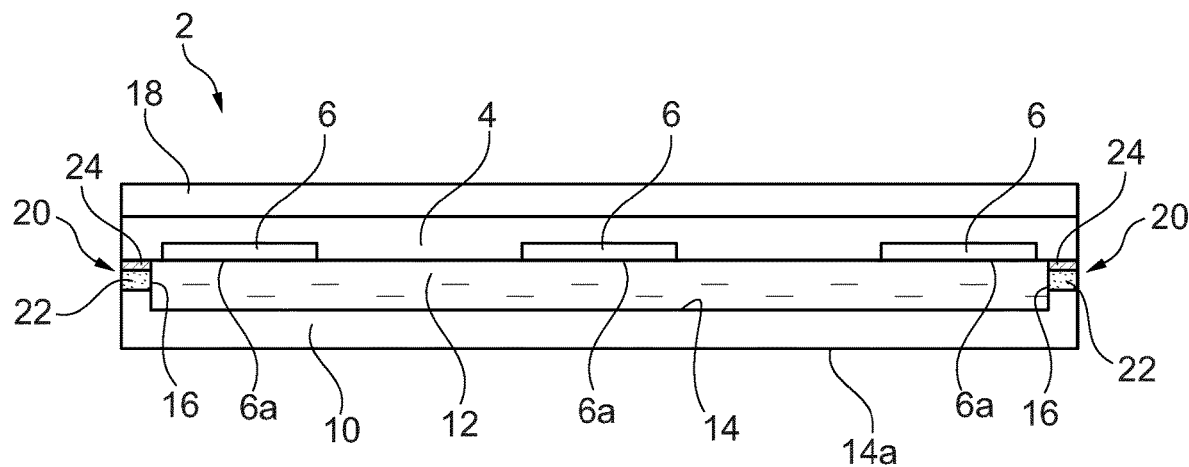
FIG. 3 is a schematic cross-sectional view of a photovoltaic module according to a second particular embodiment wherein the elements of the photovoltaic module are fixed through sealing elements.
Figure 4:
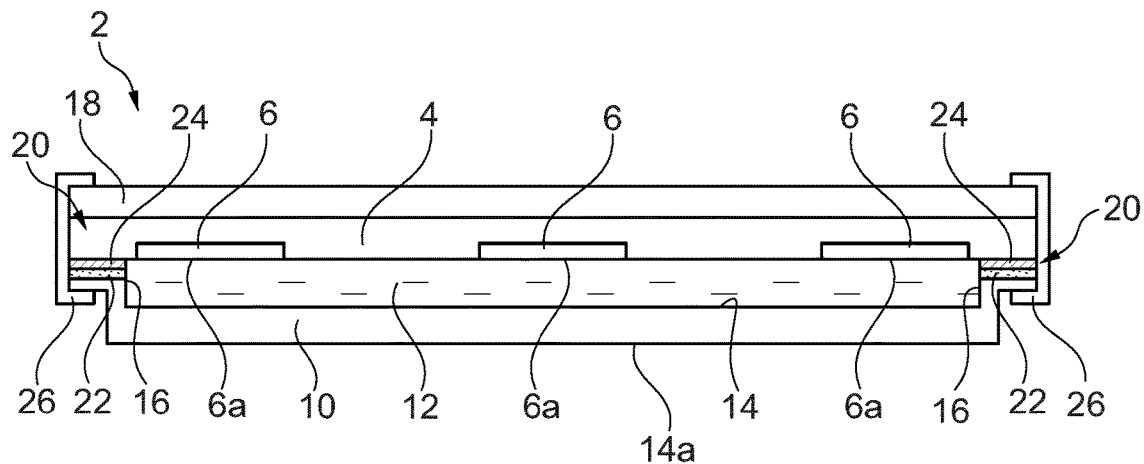
FIG. 4 is a schematic cross-sectional view of a photovoltaic module according to the second particular embodiment wherein the elements of the photovoltaic module are fixed through sealing elements, in particular with clamping elements.

Referring to FIGS. 2 to 4, there is represented a schematic cross-sectional view of the photovoltaic module 2. The front side of each photovoltaic cell 6 is attached to the front bonding layer 4. The photovoltaic module 2 further comprises the open container 10 containing the dielectric heat transfer fluid 12. The heat transfer fluid 12 may be considered as cooling fluid for heat extraction. In some specific applications, the heat transfer fluid may be considered as heating fluid and be used to supply some heat to avoid water formation at dew point temperature or even to avoid ice formation. The container 10 comprises a bottom wall 14 and side walls 16 wherein the front bonding layer 4 is disposed on top of the open container 10 in order to close the container 10 such that at least part of the backside 6a of each photovoltaic cell 6 is in contact with the dielectric heat transfer fluid 12.

Thus, the dielectric heat transfer fluid 2 is directly in contact with the backside 6a of the photovoltaic cells 6 allowing efficient extraction of the heat from the photovoltaic module 2, in particular at the level of the photovoltaic cells 6. Therefore, the operating temperature may be reduced so that the performance and power output of photovoltaic module 2 are increased. In addition, the dielectric heat transfer fluid 12 provides sufficient properties in terms of electrical resistance, safety and long-term stability for stable functioning of the photovoltaic modules 2 over the whole lifetime.

The front bonding layer 4 may comprises for example a resin that can be selected from ethyl-vinylacetate (EVA) resins, silicone, polyvinyl butyral (PVB) resins, epoxy resins, or linear or branched polyolefin resins. These different resins may be hydrophobic, which effectively prevents the entry of water within the photovoltaic module 2.

In addition, at least the resin of the front bonding layer 4 has a transmittance of more than 70%, and preferably more than 90%, for wavelength range of the photovoltaic cells 6, in particular between 300 nm and 1100 nm, to ensure good conversion efficiencies of the photovoltaic module 2. Indeed, it is required for this bonding layer 4 to have a high transmittance for certain wavelengths of the solar spectrum, and in particular the useful part of the solar spectrum for photovoltaic conversion, so as not to affect the conversion efficiencies.

Furthermore, the container 10 is for example made of a transparent material, in particular a glass or a transparent plastic material like polycarbonate or PMMA and the dielectric fluid is transparent.

In particular, the dielectric heat transfer fluid 12 presents a transmittance of more than 70%, and preferably more than 90%, for working wavelength range, in particular between 300 nm and 1100 nm, of the photovoltaic cells 6.

Thus, light can pass through the backside 14a of the bottom wall 14 of the photovoltaic module 2 in order to enhance the photovoltaic conversion efficiency of the photovoltaic module 2.

In addition, at least the material of the container has a transmittance of more than 70%, and preferably more than 90%, for working wavelength range of the photovoltaic cells 6.

The dielectric heat transfer fluid 12 presents for example resistivity of at least 1MΩ·m between 20° C. and 130° C., more specifically from 20 MΩ·m to 5000 GΩ·m between 20° C. and 130° C., and a cinematic viscosity is lower than 25 mm$^2$/s at 40° C., and may be lower than 10 mm$^2$/s at 40° C. In addition, the dielectric heat transfer fluid 12 is electrically insulating allowing thus direct contact of the heat transfer fluid 12 and the photovoltaic cells 6. Furthermore, the chemical structure of the fluid 12 is designed to have an extended life span for example, more than 10 years, in particular, about 25 years.

Furthermore, the dielectric heat transfer fluid 12 presents a thermal conductivity ranging from 105 to 180 mW/(m·K) at 25° C., a heat capacity ranging from 1500 to 3000 J/g·K, in particular around 2000 J/g·K, and a volumetric mass density ranging from 700 to 1100 kg/m$^3$ at 25° C. Thus, the dielectric heat transfer fluid 12 can extract satisfactorily excess heat from the surface of the photovoltaic cell 6.

Alternatively, the dielectric heat transfer fluid 12 may be bio-sourced or be biodegradable. The list of possible main components, alone or in combination, of such a dielectric heat transfer fluid 12 is as follows:

hydrocarbons based containing paraffins (n- and iso-) and/or
naphtenes
aromatics molecules
ester, polyalkylene glycols, ethers, estolides, silicones.

These base oils may also contain specific additives such as antioxidants, corrosion inhibitors, anti-foam agents and demulsifying agents, pour-point depressants.

In addition, the dielectric heat transfer fluid 12 is chemically compatible with the material of front bonding layer 4 and/or that of the open container 10. The list of such materials is detailed below. In addition, at least one photovoltaic cell 6 may be a bifacial photovoltaic cell. The backside 6a of the bifacial photovoltaic cell can capture the diffuse reflection of solar radiation, measured as albedo. Therefore, higher photovoltaic conversion efficiency can be achieved.

Alternatively, at least one or all photovoltaic cells 6 may be monofacial photovoltaic cells.

According to the particular embodiment, the photovoltaic module 2 may further comprise a front sheet layer 18, said front sheet layer 18 forming a front outer surface of the photovoltaic module 2.

The front sheet layer 18 provides an additional protection to the photovoltaic cells 6 while letting light to pass through it.

The front sheet layer 18 may have a transmittance greater than 70%, and preferably greater than 90%, for working wavelength range of the photovoltaic cells 6.

The front sheet layer 18 may be made of glass or a hard coat layer.

The front sheet layer 18 may have dirt repellent properties and comprise polyvinylidene fluoride (PvDF), polyvinyl fluoride (PVF), ethylene tetrafluoroethylene (ETFE), polyethylene terephthalate (PET), polyurethane, acrylic, silicone, polymethyl methacrylate (PMMA) or polycarbonate (PC).

The side walls 14 of the open container 10 and the front bonding layer 4 are fixed tightly together. The side walls 14 of the open container 10 and the front bonding layer 4 can be fixed either by chemical bonding, lamination or in a mechanical way.

According to the particular embodiment of FIG. 2, the side walls 14 of the open container 10 and the front bonding layer 4 are fixed together by lamination.

Hence, the thickness of photovoltaic module 2 can be optimized and the photovoltaic modules 2 can be arranged in a space-saving manner. In addition, polymerization reactions occurring during lamination ensure a very strong bonding between the surfaces of the photovoltaic module 2 elements to be bonded. Furthermore, the lamination of in particular the front bonding layer 4 to the photovoltaic cells 6 is carried out separately.

Preferably, the front bonding layer 4 and the container 10 may have different thicknesses and/or be composed of different materials, provided that these materials have a high chemical compatibility in order to ensure the integrity of the photovoltaic module 2 once laminated.

Alternatively, the front bonding layer 4 and the container 10 are composed of the same material. This choice prevents any risk of chemical incompatibility between the first bonding layer 4 and the container 10. Also this prevents risks of leaks for example because of different thermal expansion coefficients.

According to the particular embodiment of FIG. 3, the side walls 14 of the open container 10 and the front bonding layer 4 are fixed together through sealing elements 20 comprising an assembly rim 22 placed perpendicular to the side wall 14, and sealing elements 20 comprising a seal 24. In particular, the seal 24 may be an adhesive seal comprising for example an elastomer.

Thus, the side walls 14 of the open container 10 and the front bonding layer 4 can be fixed at ambient temperature and sealing elements 20 may adapt to different form of photovoltaic modules 2.

In addition, the fixing may be reversible which allows, for example, maintenance or replacements of some defective parts or replacement in case of a leak.

Furthermore, the presence of the assembly rim 22 helps to dampen the stress that may occur at the contact between the container 10 and the front bonding layer 4. This way, the lifespan of the container 10 and the front bonding layer 4 may be extended.

According to the particular embodiment of FIG. 4, the sealing elements 20 further comprise clamping elements 26. The clamping elements 20 allow strengthening the fixing of the front bonding layer 4 on the container 10. These clamping elements 26 allow to hold tightly to apply more strain on both side of the front bonding layer 4 and of each side wall 16 of the container 10, and optionally, on both side of the front sheet layer 18 and each side wall 16. The clamping elements 26 may comprise, without limitation, nut-bolt assembly, stud bolt, or any joints or means allowing holding a pressure vertically to the photovoltaic module 2.

Figure 5:
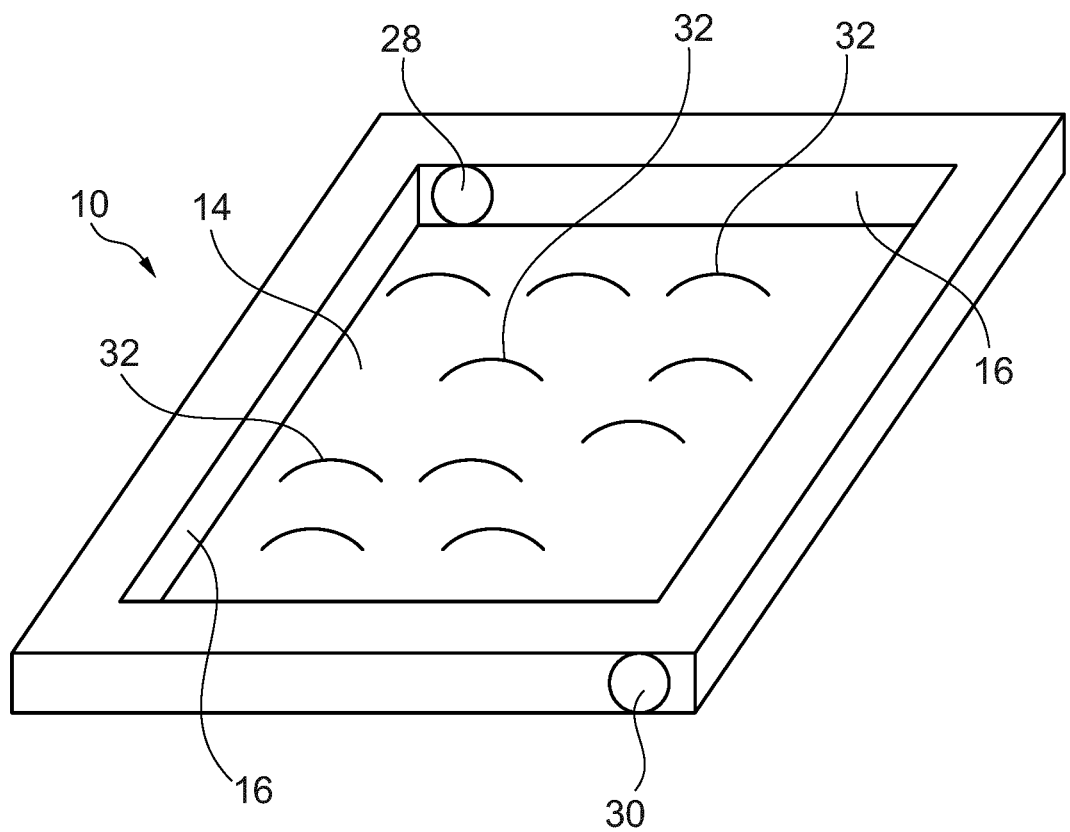
FIG. 5 is a perspective view of the open container of the photovoltaic module comprising a dielectric fluid inlet and a dielectric fluid outlet.
Figure 6:
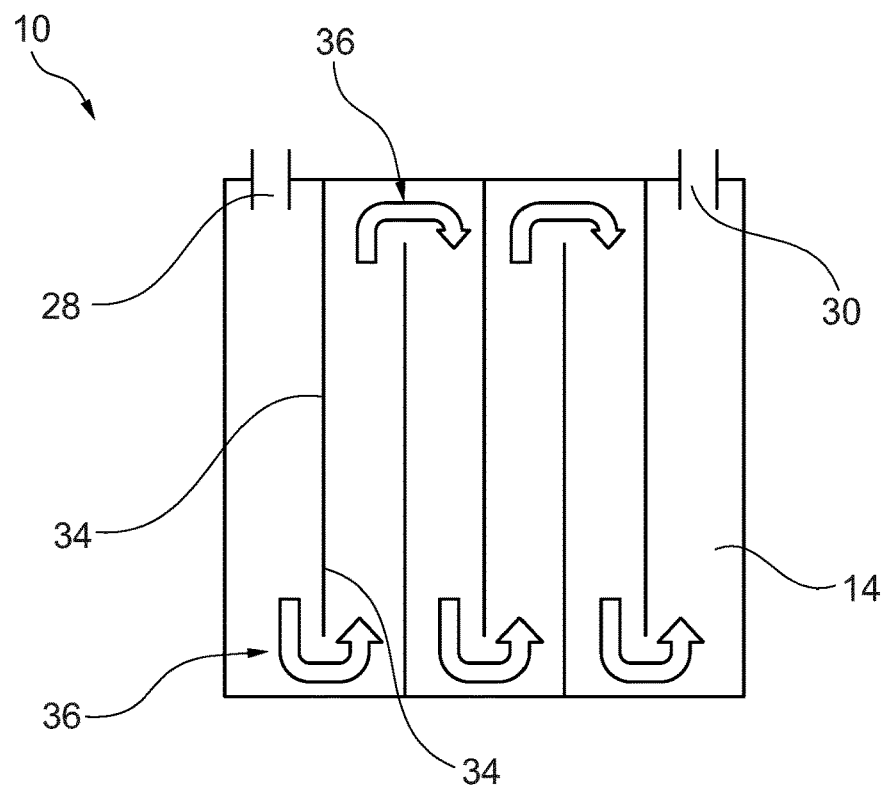
FIG. 6 is a top view of the open container of the photovoltaic module comprising a dielectric fluid inlet and a dielectric fluid outlet and further comprising separation walls perpendicular to the bottom wall.

Referring to FIGS. 5 to 6, the open container 10 comprises a dielectric fluid inlet 28 and a dielectric fluid outlet 30 allowing circulation of the dielectric heat transfer fluid 12 within the container 10. The inlet 28 and outlet 30 can be placed in any strategic places of the open container 10 so that the flow between them could be continuous. Moreover, these inlet 28 and outlet 30 are suitable for being connected to an optional external hydraulic system, in a "dynamic mode". This point will be discussed further below. The heat extraction using the dielectric heat transfer fluid 12 may be done, in a "stationary" mode, without using the external hydraulic system.

Referring to FIG. 5, the open container 10 comprises at least one wall 14, 16, in particular the bottom wall 14 comprising protuberances 32 for enhancing heat exchange between the dielectric fluid 12 and the photovoltaic cells 6.

The presence of the protuberance 32 on each wall 14, 16 enhances mixing of the dielectric fluid 12 and avoids formation of dead or stagnation zones. Thus, the heat exchange between the dielectric fluid 12 and the photovoltaic cells 6 is enhanced. The number, the form and the location of protuberances 32 may be adapted to container 10.

Now referring to FIG. 6 illustrating a top view of the container 10 which comprises separation walls 34 fixed to the bottom wall 14 and fixed to the front bonding layer 4 for forming U-shaped circulation path 36 for enhancing heat exchange between the dielectric fluid 12 and the photovoltaic cells 6 and also avoiding dead or stagnation zones of the dielectric fluid 12, in particular in the neighborhood of the photovoltaic cells 6.

The photovoltaic cells 6 are attached to the front bonding layer 4 such that they are placed over the U-shaped circulation path 36. In other words, the photovoltaic cells 6 do not overlap the separation walls 36.

In addition, such separation walls 34 might contribute to the mechanical strength of the module 2. For example, the separation walls 34 can be fixed by lamination to the front bonding layer 4 and therefore contribute to improve the mechanical strength of the module.

Figure 7:
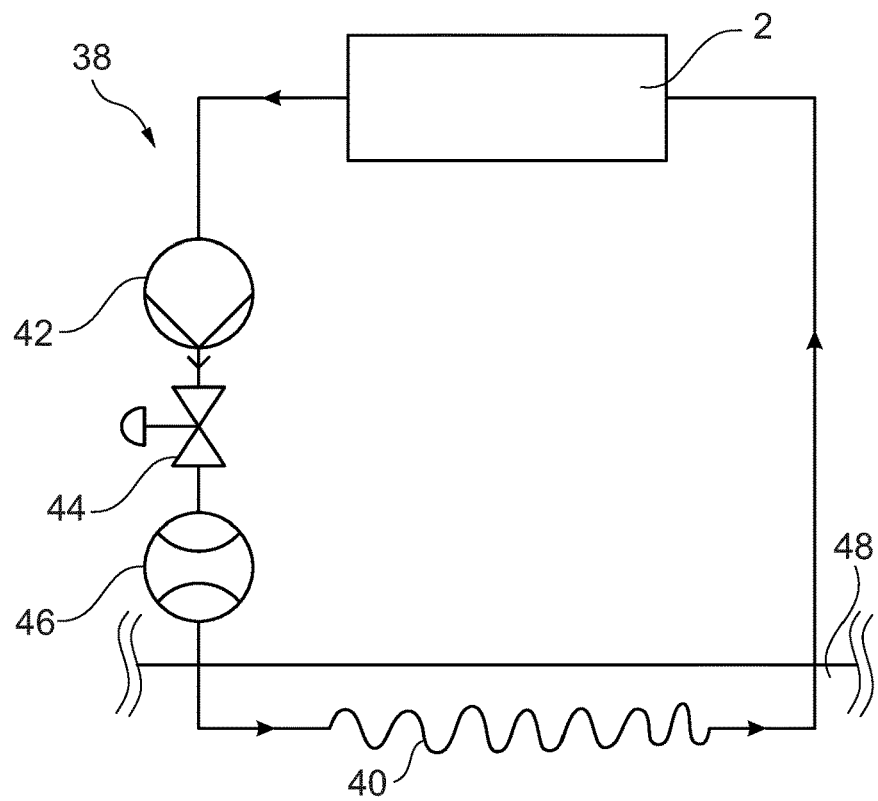
FIG. 7 is a schematic view of a photovoltaic energy production system comprising the photovoltaic module, according to a first particular embodiment.
Figure 8:
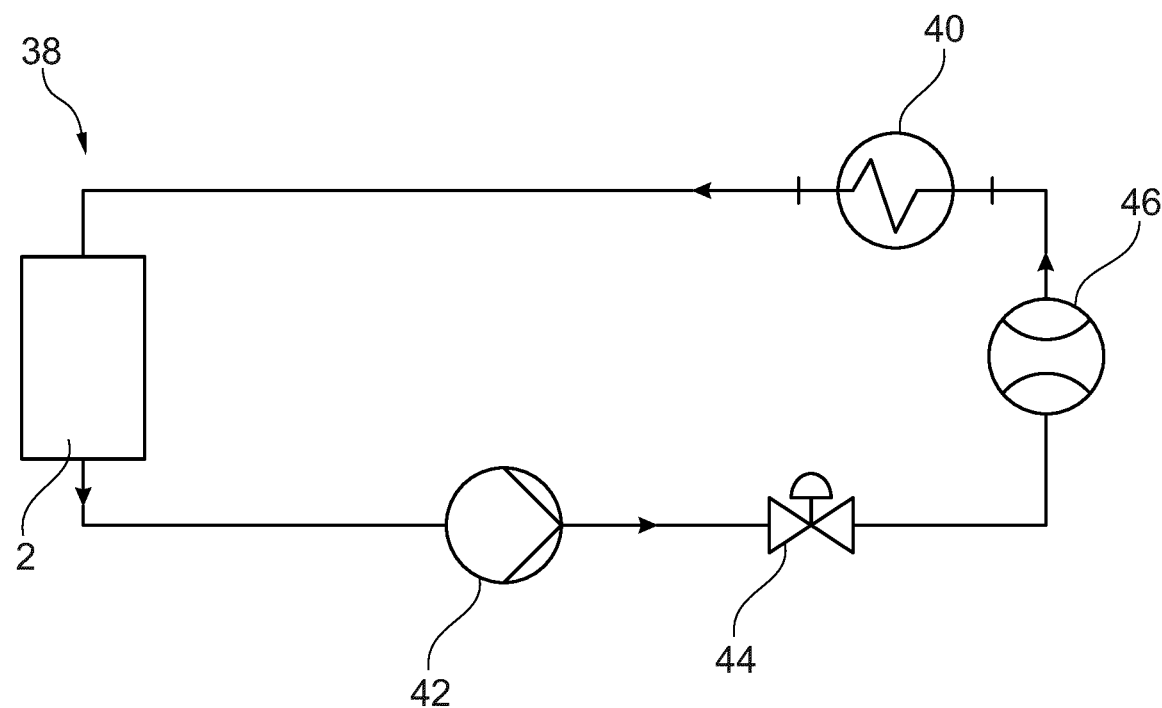
FIG. 8 is a schematic view of a photovoltaic energy production system comprising the photovoltaic module, according to a second particular embodiment.

Referring to FIGS. 7 to 8, there is represented the photovoltaic energy production system 38. The photovoltaic energy production system 38 comprises at least one photovoltaic module 2, at least one heat exchanger portion 40 and at least one pump 42. The photovoltaic module 2, the heat exchanger portion 40, the pump 42 are fluidically connected together to form a closed circuit for circulation of the dielectric heat transfer fluid 12.

This way, the dielectric fluid 12 flowing within the photovoltaic module 2 is renewed at a constant temperature or at a desired temperature.

In addition, at least one temperature sensor (not represented) may be placed within the container 10 and on the hydraulic circuit connecting the photovoltaic module 2 and the heat exchanger portion 40. Thus, the temperature of the dielectric heat transfer fluid 12 can be controlled continuously when needed and to the amount to enable efficient photovoltaic conversion.

By way of example, and without limitation, the photovoltaic energy production system 38 may further comprise at least one flow regulating valve 44 and at least one flowmeter 46 connected to control means (not represented) in order to control and monitor the flow at the inlet 28 and/or at the outlet 30 of the photovoltaic module 2. Of course, the flow regulating valve 44, and the flowmeter 46 form the closed circuit with the photovoltaic module 2, the heat exchanger portion 40, and the pump 42.

According to the particular embodiment of FIG. 7, the heat exchanger portion 40 is buried in a ground 48.

In most of cases, ground temperature, in particular at a depth of more than 1 m, is at a constant value regardless of weather conditions. This way, the heat exchange between the dielectric heat transfer fluid 12 and the photovoltaic cells 6 is optimized with a few power consumptions and the heat can be efficiently extracted.

For example, the temperature of the ground temperature may be at 25° C. degree Celsius at a depth of 1 m. The temperature of the dielectric liquid 12 can be cooled down nearly to the ground temperature.

According to the particular embodiment of FIG. 8, the heat exchanger portion 40 is formed by a classical heat exchanger. Thus, the temperature of the dielectric fluid 12 can be controlled at a desired temperature.

The here-above embodiments are illustrative and not restrictive embodiments. Obviously, many modifications and variations of the present invention are possible in the light of the above teachings without deviating from its inventive concept. It has therefore to be understood that the invention may be practiced otherwise that as specifically described.

NUMERICAL REFERENCES

2: photovoltaic module
4: front bonding layer
6: photovoltaic cell
6a: backside of the photovoltaic cell
10: open container
12: dielectric heat transfer fluid
14: bottom wall
14a: backside of the bottom wall
16: side wall
18: front sheet layer
20: sealing elements
22: assembly rim
24: seal
26: clamping elements
28: inlet of the open container
30: outlet of the open container
32: protuberance
34: separation wall in the open container
36: U-shaped circulation path
38: photovoltaic energy production system
40: heat exchanger portion
42: pump
44: flow regulating valve
46: flow meter
48: ground

The invention claimed is:

1. Photovoltaic module wherein the photovoltaic module comprises:
 a front bonding layer;
 photovoltaic cells attached to the front bonding layer, such that a front side of each photovoltaic cell is attached to the front bonding layer;
 an open container containing a dielectric cooling fluid, the open container comprising a bottom wall and side walls; wherein
 the front bonding layer is disposed on top of the open container in order to close the open container such that at least part of the backside of each photovoltaic cell is directly in contact with the dielectric cooling fluid.

2. The photovoltaic module according to claim 1, wherein the side walls of the open container and the front bonding layer are fixed tightly together.

3. The photovoltaic module according to claim 2, wherein the side walls of the open container and the front bonding layer are fixed together by lamination.

4. The photovoltaic module according to claim 2, wherein the side walls of the open container and the front bonding layer are fixed together through sealing elements.

5. The photovoltaic module according to claim 4, wherein the side walls of the open container present an assembly rim, perpendicular to the side walls and the sealing elements comprise a seal, in particular an adhesive seal.

6. The photovoltaic module according to claim 4, wherein the sealing elements comprise clamping elements.

7. The photovoltaic module according to claim 1, wherein the open container is made of a transparent material and the dielectric cooling fluid is transparent.

8. The photovoltaic module according claim 1, wherein the dielectric cooling fluid presents a transmittance of more than 70% for working wavelength range of the photovoltaic cells.

9. The photovoltaic module according to claim 1, wherein at least one photovoltaic cell is a bifacial photovoltaic cell.

10. The photovoltaic module according to claim 1, wherein the open container comprises a dielectric fluid inlet and a dielectric fluid outlet allowing circulation of the dielectric cooling fluid within the open container.

11. The photovoltaic module according to claim 1, wherein at least one wall comprises protuberances for enhancing heat exchange between the dielectric cooling fluid and the photovoltaic cells.

12. The photovoltaic module according to claim 1, wherein the open container comprises separation walls fixed to the bottom wall and fixed to the front bonding layer for forming U-shaped circulation path.

13. The photovoltaic module according to claim 1, wherein the dielectric cooling fluid presents:
 a resistivity ranging at least 1 MΩ·m between 20° C. and 130° C.;
 a kinematic viscosity is lower than 25 mm$^2$/s at 40° C.

14. The photovoltaic module according to claim 1, wherein the dielectric cooling fluid presents:
 a thermal conductivity ranging from 105 to 180 mW/(m·K) at 25° C.;
 a heat capacity ranging from 1500 to 3000 J/g·K and
 a volumetric mass density ranging from 700 to 1100 kg/m$^3$ at 25° C.

15. Photovoltaic energy production system comprising:
 at least one photovoltaic module according claim 1;
 at least one heat exchanger portion;
 at least one pump;
the at least one photovoltaic module, the at least one heat exchanger portion and the at least one pump are fluidically connected together to form a closed circuit for circulation of the dielectric heat transfer fluid.

* * * * *